US012757324B2

(12) United States Patent
Takaya et al.

(10) Patent No.: US 12,757,324 B2
(45) Date of Patent: Oct. 6, 2026

(54) WIRING BOARD, ELECTRONIC COMPONENT STORAGE PACKAGE, AND ELECTRONIC DEVICE

(71) Applicant: KYOCERA Corporation, Kyoto (JP)

(72) Inventors: Shigenori Takaya, Kyoto (JP); Tomoya Kon, Yasu (JP); Kyosuke Fukuda, Omihachiman (JP)

(73) Assignee: Kyocera Corporation, Kyoto (JP)

( * ) Notice: Subject to any disclaimer, the term of this patent is extended or adjusted under 35 U.S.C. 154(b) by 266 days.

(21) Appl. No.: 18/572,653

(22) PCT Filed: Jun. 17, 2022

(86) PCT No.: PCT/JP2022/024287

§ 371 (c)(1),
(2) Date: Dec. 20, 2023

(87) PCT Pub. No.: WO2022/270429

PCT Pub. Date: Dec. 29, 2022

(65) Prior Publication Data

US 2024/0292530 A1 Aug. 29, 2024

(30) Foreign Application Priority Data

Jun. 21, 2021 (JP) ................................ 2021-102349

(51) Int. Cl.
*H05K 1/02* (2006.01)
*H05K 1/11* (2006.01)

(52) U.S. Cl.
CPC ......... *H05K 1/0298* (2013.01); *H05K 1/0245* (2013.01); *H05K 1/115* (2013.01); *H05K 2201/09727* (2013.01)

(58) Field of Classification Search
CPC .... H05K 1/0298; H05K 1/0245; H05K 1/115; H05K 2201/09727; H05K 1/0243; H05K 1/11; H05K 1/02; H01L 23/12; H01S 5/02208; H01S 5/0231
See application file for complete search history.

(56) References Cited

U.S. PATENT DOCUMENTS 4,953,171 A * 8/1990 Nakajima ............ G02B 6/4206
372/44.01
2012/0287955 A1* 11/2012 Kimura ............... H01S 5/02212
372/44.01

FOREIGN PATENT DOCUMENTS

| | | |
|---|---|---|
| JP | 11-312760 A | 11/1999 |
| JP | 2012-238640 A | 12/2012 |
| JP | 2014-197086 A | 10/2014 |
| WO | 2020/138209 A1 | 7/2020 |

* cited by examiner

*Primary Examiner* — Timothy J Thompson
(74) *Attorney, Agent, or Firm* — Volpe Koenig

(57) ABSTRACT

A wiring board includes: a base including first and second faces and a side face therebetween; a signal electrode on the first face; first and second recesses in the side face extending to the first face; and first and second ground conductors on inner surfaces of the first and second recesses, respectively. When viewed perpendicular to the first face, an outline of the base includes at least one circular arc; the signal electrode extends from a center region toward the circular arc and is shifted from a normal line passing through a center point of the circular arc; and the first and second recesses overlap the circular arc, with the first recess on one side of the signal electrode and the second recess on the other side.

15 Claims, 5 Drawing Sheets

WIRING BOARD, ELECTRONIC COMPONENT STORAGE PACKAGE, AND ELECTRONIC DEVICE

TECHNICAL FIELD

The present disclosure relates to a wiring board, an electronic component storage package, and an electronic device.

BACKGROUND OF INVENTION

Japanese Unexamined Patent Application Publication No. 2012-238640 discloses a package for an optical semiconductor device, including a ceramic wiring board.

SUMMARY

Solution to Problem

According to the present disclosure, a wiring board includes a base, a signal electrode, a first recess, a second recess, a first ground conductor, and a second ground conductor. The base includes a first face, a second face opposite to the first face, and a side face between the first face and the second face. The signal electrode is located on the first face. The first recess and the second recess are located in the side face and extend to the first face. The first ground conductor is located on an inner surface of the first recess. The second ground conductor is located on an inner surface of the second recess. When viewed in a first direction perpendicular to the first face, an outline of the base includes at least one circular arc. When viewed in the first direction, the signal electrode extends from a center region on the first face toward the circular arc and is shifted from a normal line passing through a center point of the circular arc. When viewed in the first direction, the first recess and the second recess overlap the circular arc, and the first recess is on one side of the signal electrode, and the second recess is on the other side of the signal electrode.

According to the present disclosure, an electronic component storage package includes the wiring board described above and a frame. The frame is located on the second face.

According to the present disclosure, an electronic device includes the electronic component storage package described above, an electronic component, and a module substrate. The electronic component is mounted on the wiring board. The module substrate is joined to the signal electrode, the first ground conductor, and the second ground conductor.

DESCRIPTION OF EMBODIMENTS

Figure 1:
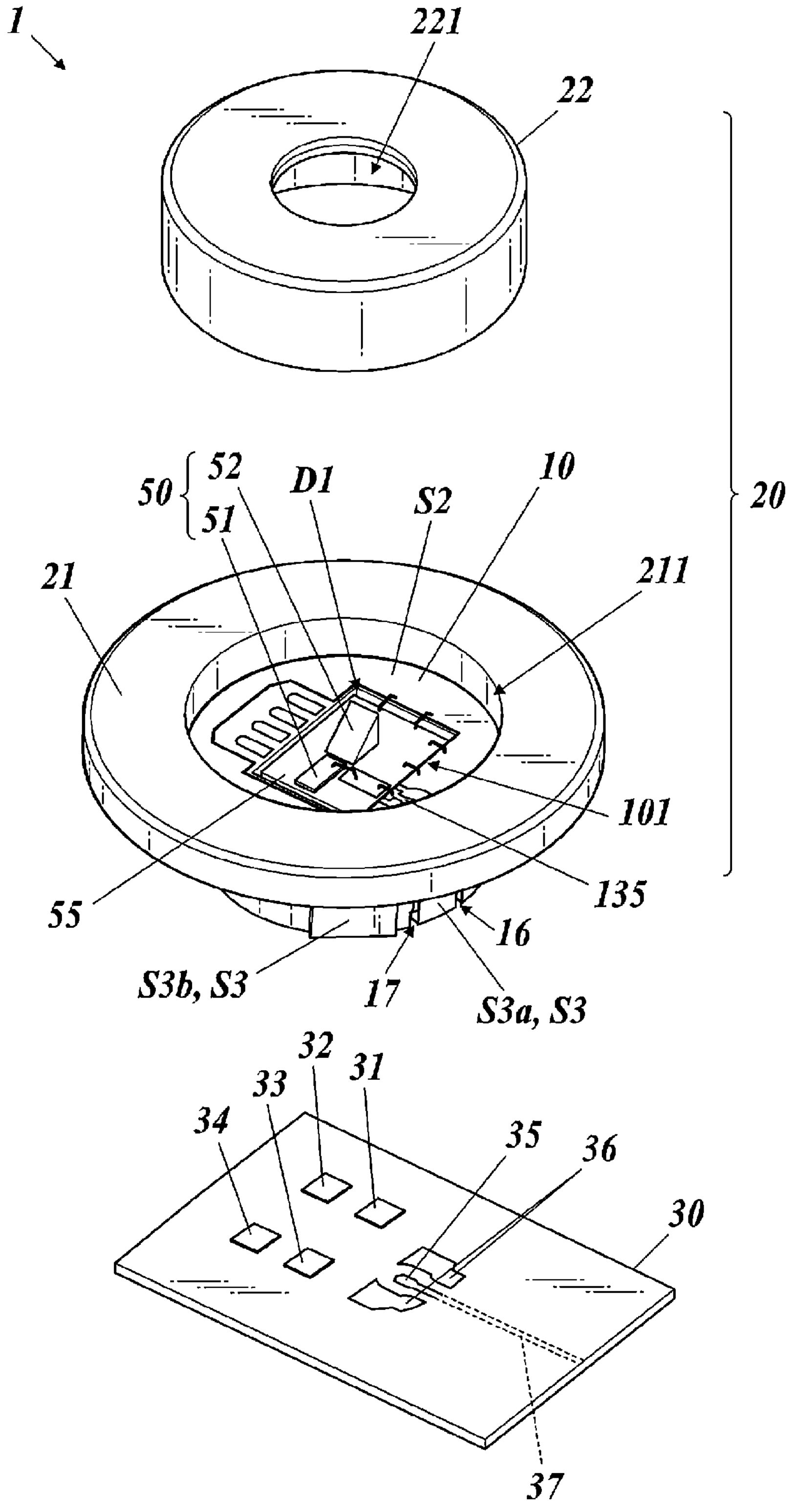
FIG. 1 is an exploded perspective view of an electronic device according to an embodiment of the present disclosure.

Hereinafter, an embodiment of the present disclosure will be described in detail with reference to the drawings. FIG. 1 is an exploded perspective view of an electronic device according to the embodiment of the present disclosure.

As illustrated in FIG. 1, an electronic device 1 of the present embodiment includes an electronic component storage package 20 including a wiring board 10 and also includes a module substrate 30 on which the wiring board 10 is to be mounted and a component 50 to be mounted on the wiring board 10.

The electronic component storage package 20 includes the wiring board 10 including a component mount portion 101 and also includes a frame 21 and a lid 22. The frame 21 is joined to the wiring board 10 and the lid 22 and supports the wiring board 10 and the lid 22. The frame 21 may be made of a metal and have a disk shape including a through-hole 211 at its center. The periphery of the opening of the through-hole 211 on one face of the frame 21 may be joined to the wiring board 10. The component mount portion 101 may be open to the other side through the through-hole 211. The lid 22 is joined to the other face of the frame 21 and covers the component mount portion 101 of the wiring board 10. The lid 22 includes an opening 221 that allows light to pass through, and the opening 221 may be closed with a transparent member.

The module substrate 30 may be a flexible printed circuit (FPC). The module substrate 30 includes a plurality of electrodes 31 to 36 that is electrically connected to the wiring board 10. The module substrate 30 includes a signal line 37 to or from which a high frequency signal is input or output. The signal line 37 is connected to an electrode 35.

The component 50 includes an electronic component 51 and an optical component 52 and is mounted on the component mount portion 101 of the wiring board 10. The component 50 may be mounted on the component mount portion 101 with a sub-mount 55 interposed therebetween. The electronic component 51 may be a component that receives or outputs a high frequency signal. In the example of FIG. 1, the electronic component 51 is an optical semiconductor component such as a semiconductor laser, and the optical component 52 is a prism that reflects the light emitted by the electronic component 51, toward the opening 221 of the lid 22. The optical component 52 may be a lens, and the electronic component 51 may be a light reception element such as a photodiode. The optical component 52 may be located so as to adapt to a light emission position or a light incident position. The electronic component 51 may be located so as to adapt to the position of the optical component 52. In addition, the component 50 may include a circuit component such as a capacitor or a resistor.

Figure 2:
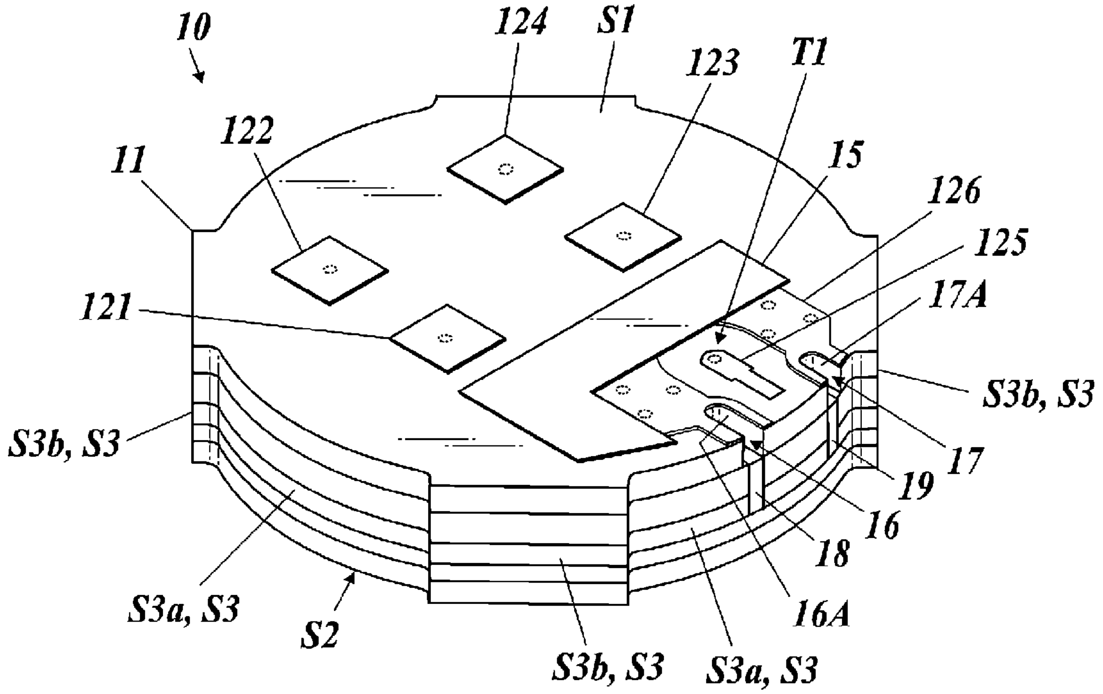
FIG. 2 is a perspective view of a wiring board in FIG. 1.
Figure 3:
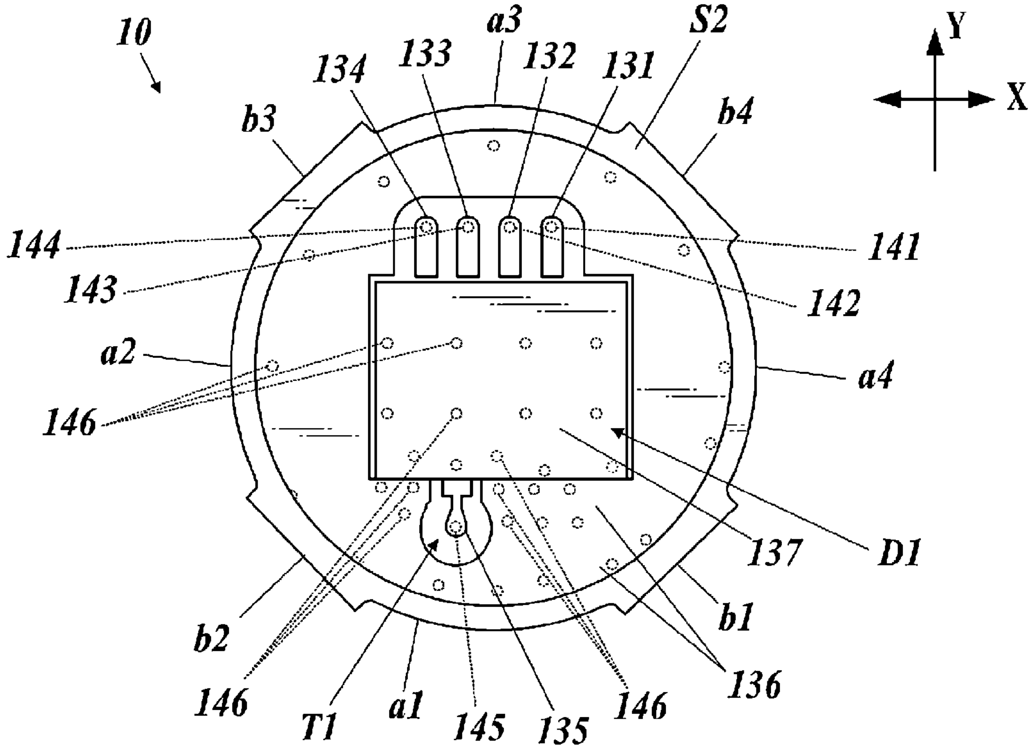
FIG. 3 is a plan view of the front side of the wiring board in FIG. 1.
Figure 4A:
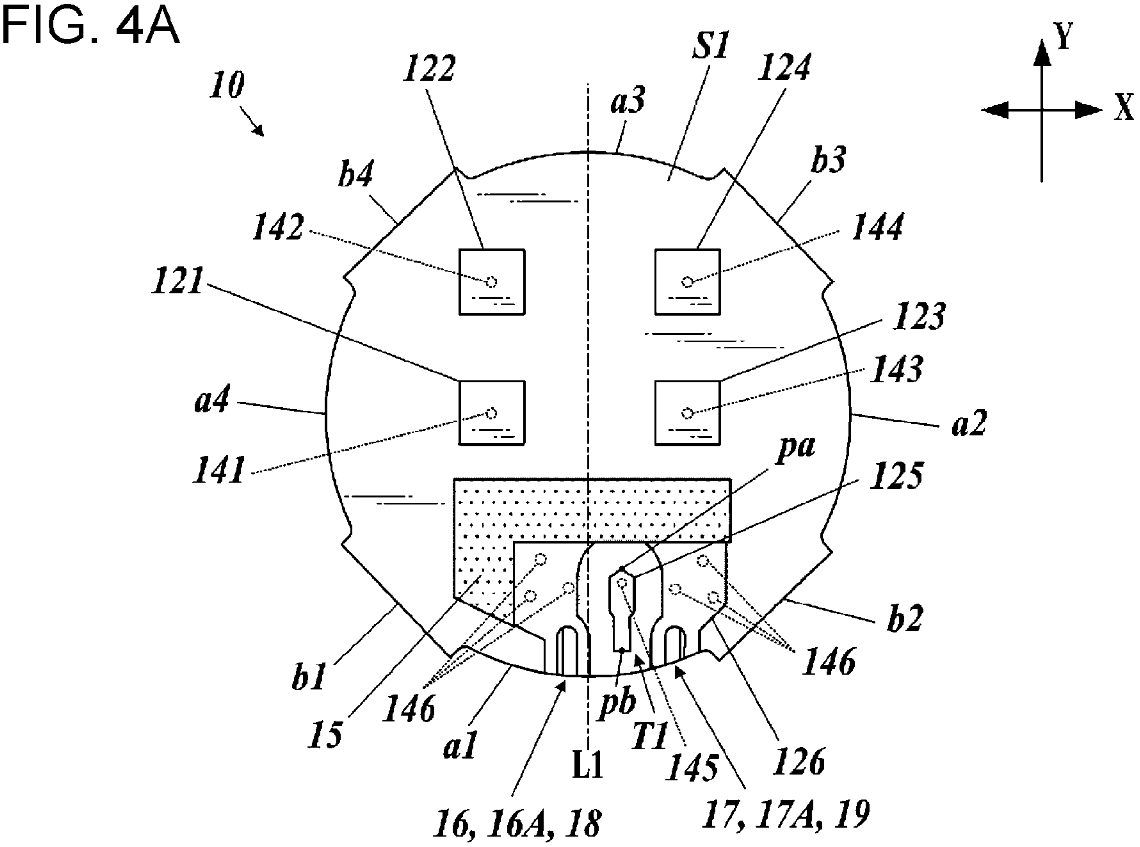
FIG. 4A is a plan view of the back side of the wiring board in FIG. 1.
Figure 4B:
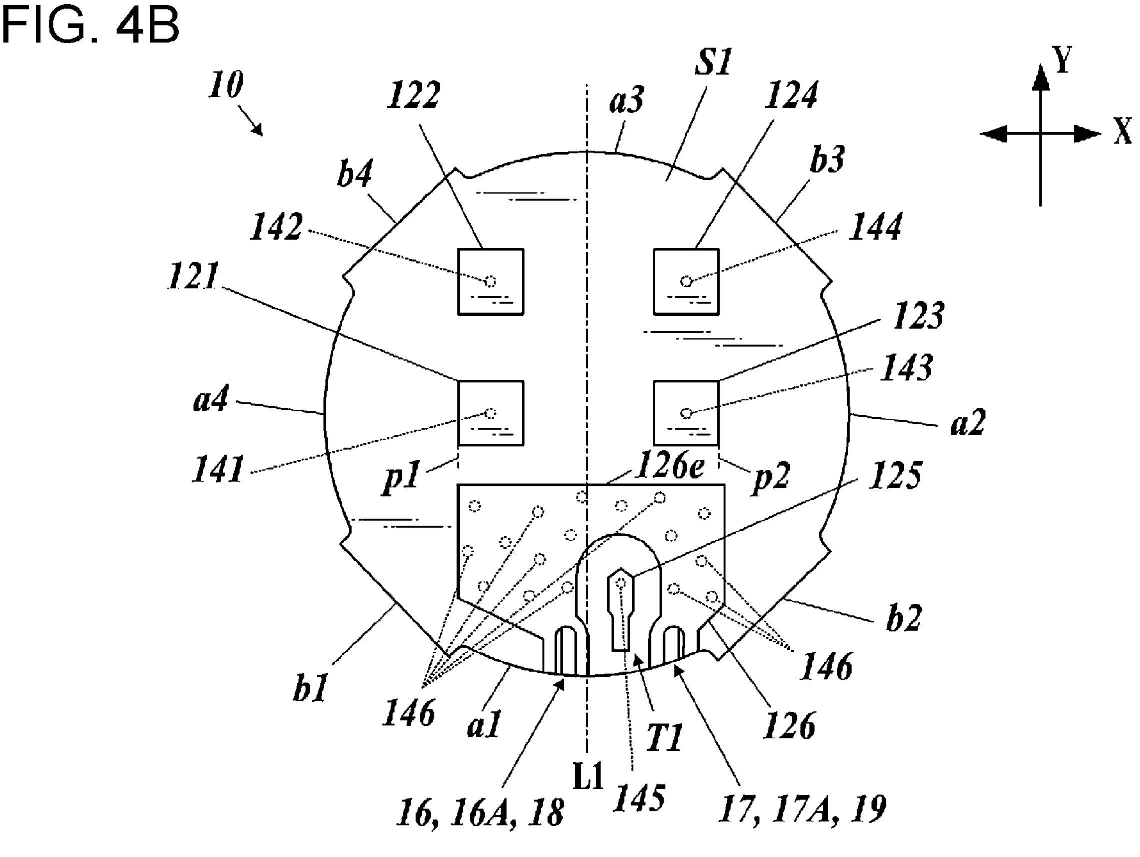
FIG. 4B is a plan view of the back side of the wiring board in FIG. 1 without an insulation film.
Figure 5:
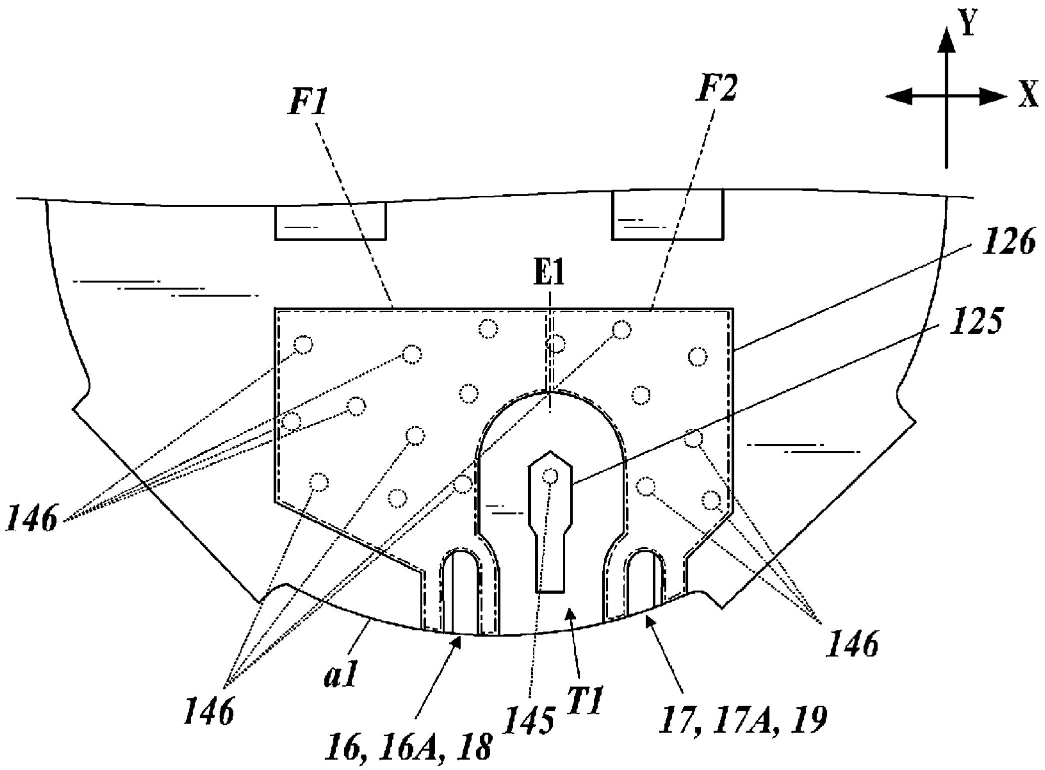
FIG. 5 is an enlarged plan view of a ground electrode and its periphery on a first face.

FIG. 2 is a perspective view of the wiring board in FIG. 1. This perspective view is from the back side of the wiring board 10. FIG. 3 is a plan view of the front side of the wiring board in FIG. 1. FIG. 4A is a plan view of the back side of the wiring board in FIG. 1. FIG. 4B is a plan view of the back side of the wiring board without an insulation film. FIG. 5 is an enlarged plan view of a ground electrode and its periphery on a first face.

The wiring board 10 includes abase 11 including a first face S1, a second face S2 opposite to the first face S1, and a side face S3 extending from the first face S1 to the second face S2. Here, the back side mentioned above refers to the first face S1 of the wiring board 10, and the front side mentioned above refers to the second face S2 of the wiring board 10.

The base 11 may be layers of a dielectric material. Examples of dielectric materials include ceramic materials such as alumina-based sintered materials, mullite-based sintered materials, silicon-carbide-based sintered materials, aluminum nitride-based sintered materials, and silicon-nitride-based sintered materials; or glass ceramic materials.

The base 11 may have, for example, a circular shape when viewed in the direction (first direction) perpendicular to the first face S1. The term "circular shape" mentioned here may include a shape in which part of a circle is recessed and a shape in which part of a circle protrudes. When the base 11 is a circular shape, the radius of the circle may be 0.5 to 5 mm, and the height of the base 11 may be 0.5 to 10 mm. Here, the height direction refers to the direction perpendicular to the first face S1.

As illustrated in FIG. 4A, the outline of the base 11 when viewed in the direction perpendicular to the first face S1 includes at least one circular arc a1. The outline may include a plurality of circular arcs a1 to a4 and a plurality of straight lines b1 to b4. The circular arcs a1 to a4 and the straight lines b1 to b4 may be arranged alternately. The plurality of circular arcs a1 to a4 may have the same center of curvature.

As illustrated in FIG. 2, the side face S3 of the base 11 extends in the direction perpendicular to the first face S1. The side face S3 includes curved surface portions S3*a* and flat surface portions S3*b*. The circular arcs a1 to a4 correspond to the outlines of the curved surface portions S3*a* when viewed in the direction perpendicular to the first face S1. The straight lines b1 to b4 correspond to the outlines of the flat surface portions S3*b* when viewed in the direction perpendicular to the first face S1.

As illustrated in FIG. 3, the second face S2 of the base 11 includes a recess D1 open upward. Here, the upward direction refers to the direction from the first face S1 toward the second face S2. In the following, the direction from the first face S1 toward the second face S2 is sometimes referred to as the upward direction in the present disclosure. The component mount portion 101 may be located in the recess D1. Specifically, the sub-mount 55 (FIG. 1) may be mounted in the recess D1, and the component 50 mentioned above may be mounted on the sub-mount 55.

As illustrated in FIGS. 2, 3 and 4A, the wiring board 10 further includes electrodes (121 to 126) on the first face S1, electrodes (131 to 137) on the second face S2, and internal conductors (141 to 146) inside the base 11. The wiring board 10 further includes an insulation film 15 covering part of the electrode mentioned above. The insulation film 15 may be an alumina coat.

The electrodes on the second face S2 include a plurality of power-supply electrodes 131 to 134, a signal electrode 135 through which a high frequency signal is transmitted, and ground electrodes 136 and 137.

The signal electrode 135 may be located at a position shifted from the center of the second face S2 so as to adapt to the position of the electronic component 51. As illustrated in FIG. 1, the optical component 52 may be located at the center of the second face S2, and the electronic component 51 may be shifted from the center of the second face S2 so as to adapt to the optical component 52. This position of the optical component 52 enables the electronic device 1 to emit and receive light from the center portion of the second face S2, and this position of the electronic component 51 mentioned above enables the electronic component 51 to emit and receive light so as to adapt to the position of the optical component 52. This position of the signal electrode 135 mentioned above enables the electronic device 1 to transmit a signal with less electric power loss so as to adapt to the position of the electronic component 51. The signal electrode 135 may have a shape elongated in one direction. The signal electrode 135 may be oriented such that its longitudinal direction is orthogonal to one side of the electronic component 51. In such arrangement, the line passing through the signal electrode 135 in the longitudinal direction does not pass through the center of the second face S2.

The ground electrode 136 is located outside the recess D1 and surrounds the signal electrode 135. The ground electrode 137 is located on an inner bottom face of the recess D1. The ground electrode 137 may be located on also part of an inner side face of the recess D1 and may be connected to the ground electrode 136 outside the recess D1.

The power-supply electrodes 131 to 134 may be located outside the recess D1 on the opposite side of the recess D1 from the signal electrode 135. Specifically, the power-supply electrodes 131 to 134 may be located on one side of the recess D1, and the signal electrode 135 may be located on the other side of the recess D1.

As illustrated in FIGS. 4A and 4B, the electrodes on the first face S1 include a plurality of power-supply electrodes 121 to 124, a signal electrode 125 through which a high frequency signal is transmitted, and a ground electrode 126. The ground electrode 126 surrounds the signal electrode 125 except part of the periphery. The part of the periphery may be near a portion of the outer edge of the first face S1 closest to the signal electrode 125. The power-supply electrodes 121 to 124 are located in the region opposite of the ground electrode 126 from the signal electrode 125. In other words, the power-supply electrodes 121 to 124 are located on one side of the ground electrode 126, and the signal electrode 125 is located on the other side of the ground electrode 126. The power-supply electrodes 121 to 124 may be arranged in two rows and two columns in a normal-line direction Y and a lateral direction X (see FIG. 4A). The power-supply electrodes 121 to 124 may be symmetric with respect to a normal line L1 (FIG. 4A). The normal line L1, the lateral direction X, and the normal-line direction Y will be described later.

The internal conductors inside the base 11 include power-supply conductors 141 to 144 electrically connecting the power-supply electrodes 121 to 124 on the first face S1 and the power-supply electrodes 131 to 134 on the second face S2, respectively. When the base 11 is composed of a plurality of stacked dielectric layers, each of the power-supply conductors 141 to 144 may include a combination of via conductors passing through each dielectric layer and film conductors between two adjacent dielectric layers. Each via conductor may have a columnar shape extending in the direction perpendicular to the first face S1 and may be filled with a conductive material.

The internal conductors located inside the base 11 further include a signal conductor 145 electrically connecting the signal electrode 125 of the first face S1 and the signal electrode 135 of the second face S2. The signal conductor 145 may have a configuration in which via conductors are connected in a straight line or may have a configuration in which a plurality of via conductors and one or more film conductors are connected stepwise. The film conductors of the signal conductor 145 may have a belt shape.

The internal conductors inside the base 11 further include a plurality of ground conductors 146 electrically connecting the ground electrode 126 on the first face S1 and the ground electrodes 136 and 137 on the second face S2. The ground conductors 146 include a plurality of via conductors connected from the first face S1 to the second face S2 in straight lines. The plurality of ground conductors 146 is located around the signal conductor 145 at intervals that reduce high frequency signal leakage. Some of the ground conductors 146 may be located between the power-supply conductors 141 to 144 and the signal conductor 145. The plurality of ground conductors 146 may include film conductors, and some ground conductors 146 may be electrically connected to one another with one film conductor interposed therebetween. A film conductor included in the ground conductors 146 may extend to have a size the same as or similar to the ones of the ground electrodes 126, 136, and 137 or may extend to have a size smaller than the ones of the ground electrodes 126, 136, and 137. A film conductor included in the ground conductors 146 may also be a belt shape. In other words, in a transparent plan view in the height direction, the area of the film conductor included in the ground conductors 146 may be the same as or similar to or may be smaller than the area of the ground electrodes 126, 136, and 137.

As illustrated in FIG. 2, the wiring board 10 further includes a first recess 16, a second recess 17, a first ground conductor 16A, a second ground conductor 17A, a first filled via (first via) 18, and a second filled via (second via) 19. The first ground conductor 16A is a film conductor which is located on an inner surface of the first recess 16. The second ground conductor 17A is a film conductor which is located on an inner surface of the second recess 17. The first filled via 18 is partially exposed on the side face S3. The second filled via 19 is partially exposed on the side face S3.

The configuration including the first recess 16 and the first ground conductor 16A may be referred to as "castellation". Similarly, the configuration including the second recess 17 and the second ground conductor 17A may be referred to as "castellation". The openings of the first recess 16 and the second recess 17 are located in the side face S3 and extend to the first face S1. The first ground conductor 16A may be located on at least a first inner wall surface S16*i* (FIG. 7A) which is the closest to the signal electrode 125 among the inner surfaces of the first recess 16. The first ground conductor 16A may be located on all the inner surfaces of the first recess 16. The second ground conductor 17A may be located on at least a second inner wall surface S17*i* (FIG. 7A) which is the closest to the signal electrode 125 among the inner surfaces of the second recess 17. The second ground conductor 17A may be located on all the inner surfaces of the second recess 17. The first ground conductor 16A and the second ground conductor 17A may be connected to the ground electrode 126.

The first filled via 18 is located at a position closer to the second face S2 than the first recess 16 and is connected to the first recess 16. The second filled via 19 is located at a position closer to the second face S2 than the second recess 17 and is connected to the second recess 17. The first filled via 18 and the second filled via 19 each have a configuration in which a hole in the base 11 is filled with a conductive material, and part of the conductive material is exposed on the side face S3. The first filled via 18 may be connected to the first ground conductor 16A. The second filled via 19 may be connected to the second ground conductor 17A.

In the wiring board 10, a signal line including the signal electrode 125, the signal conductor 145, and the signal electrode 135 and their surrounding configurations compose a transmission path T1 for transmitting a high frequency signal. The surrounding configurations include dielectric (the base 11) around the above signal lines and the plurality of ground conductors located around the signal lines with the surrounding dielectric interposed therebetween. The ground conductors include the ground electrode 126 on the first face S1, the ground conductors 146 inside the base 11, the first ground conductor 16A, the second ground conductor 17A, the first filled via 18, the second filled via 19, and the ground electrode 136 on the second face S2.

<Method for Manufacturing Wiring Board 10>

The following method can manufacture the wiring board 10 as an example. For example, when the base 11 is made of a ceramic material, a glass ceramic material, or the like, first, a green sheet of such a material before firing is provided with a conductive material and an insulation material to form one sheet-shaped molded product. Here, the conductive material mentioned above is for forming the electrodes (121 to 126 and 131 to 137), the first ground conductor 16A, the second ground conductor 17A, the first filled via 18, the second filled via 19, and the internal conductors (141 to 146). The insulation material mentioned above is for forming the insulation film 15.

When the base 11 includes a plurality of stacked dielectric layers, the process mentioned above for providing the conductive material and the insulation material may be performed for each layer. Specifically, holes are formed in a green sheet for each layer, and the holes are filled with conductive paste to provide a green sheet of each layer with the conductor material for forming the via conductors for the internal conductors (141 to 146), the first filled via 18, and the second filled via 19. A green sheet for an intermediate layer can be provided with a conductive material for forming the film conductors for the internal conductors (141 to 146) by applying conductive paste to a surface of the green sheet for each layer by pattern printing. Green sheets for outer layers can be provided with a conductive material for forming the electrodes (121 to 126, 131 to 137). Then, holes are formed in green sheets for specified layers, and conductive paste is applied to inner walls of the holes to provide these green sheets with a conductor material for forming the first ground conductor 16A in the first recess 16 and the second ground conductor 17A in the second recess 17. After that, layers of green sheets are stacked to form one sheet-shaped molded product before firing.

The first recess 16 and the second recess 17 may be formed in one or more layers from the one closest to the first face S1. Similarly, the first ground conductor 16A and the second ground conductor 17A may be formed on one or more layers from the one closest to the first face S1. The first filled via 18 and the second filled via 19 may be formed in one or more layers immediately above the layers including the first recess 16 and the second recess 17.

The sheet-shaped molded product is produced such that one sheet-shaped molded product includes a plurality of molded products arranged in rows and columns, each including the configuration of an individual wiring board 10, so that a large number of wiring boards 10 can be obtained from the one sheet-shaped molded product.

Then, die cutting is performed on the sheet-shaped molded product to form part of the outer shape of each individual molded product. This process is performed such that adjacent molded products are still partially connected so that the multiple molded products will not separate. The above die cutting forms the curved surface portions S3*a* of the side face S3 of the base 11 in each molded product. In addition, by the above die cutting, the first recess 16 and the second recess 17 appear on the curved surface portion S3*a* of the side face S3, and the first filled via 18 and the second filled via 19 are exposed in the curved surface portion S3*a* of the side face S3. The curved surface portions S3*a* of the side face S3 are portions including the circular arcs a1 to a4 when viewed in the direction perpendicular to the first face 51.

Then, the sheet-shaped molded product is fired. Through the firing, a fired product including the multiple molded products arranged in rows and columns, each serving as an individual wiring board 10, is obtained.

Then, through a cutting process such as a slicing process, the above fired product is separated into individual molded products. This cutting process forms the flat surface portions S3*b* of the side face S3. The flat surface portions S3*b* of the side face S3 are portions including the straight lines b1 to b4 when viewed in the direction perpendicular to the first face S1. Then, a separated individual molded product serves as one wiring board 10. Through the manufacturing method mentioned above, a large number of wiring boards 10 can be manufactured efficiently.

<Joining Between Module Substrate 30 and Wiring Board 10>

The electrodes 31 to 36 of the module substrate 30 are joined to the power-supply electrodes 121 to 124, the signal electrode 125, and the ground electrode 126 of the wiring board 10 with a conductive joining material (such as a brazing material) interposed therebetween. Here, since part of the ground electrode 126 is covered with the insulation film 15, the portions of the ground electrode 126 not covered with the insulation film 15 are joined to the electrodes 36 of the module substrate 30. When the ground electrode 126 and the electrodes 36 of the module substrate 30 are joined, part of the conductive joining material flows into the inner surfaces of the first recess 16 and the inner surfaces of the second recess 17 before being solidified.

<Details of Configurations around Signal Electrode 125>

As illustrated in FIG. 4B, the circular arc a1 located near the signal electrode 125 has a shape symmetric with respect to the normal line L1 passing through the center point of the circular arc a1. The normal line of a circular arc refers to the straight line perpendicular to the tangent line of the circular arc and included in the same plane as the circular arc. The normal line L1 may be a straight line included in the first face S1 or may be a straight line parallel to the first face S1. The normal line L1 may pass through the center point of the first face S1.

In the present embodiment, the direction of the normal line L1 parallel to the first face S1 is referred to as the normal-line direction Y The direction perpendicular to the normal line L1 and parallel to the first face S1 is referred to as the lateral direction X. A lateral width, when referred to in the following, means the width in the lateral direction X (the dimension in the lateral direction X), and the right and left means one side and the other side in the lateral direction X.

The first recess 16 and the second recess 17, when viewed in the direction perpendicular to the first face S1, may overlap the circular arc a1, and the first recess 16 may be located on one side of the signal electrode 125 and the second recess 17 on the other side. With this arrangement, a portion of the signal electrode 125 close to the circular arc a1 can be flanked by the first ground conductor 16A in the first recess 16 and the second ground conductor 17A in the second recess 17 on the right and left sides. This arrangement of the first recess 16 and the second recess 17 makes it possible to avoid a conductor covering immediately above the signal line 37 of the module substrate 30. In addition, this arrangement also enables the first ground conductor 16A and the second ground conductor 17A to be located on either side of part of the transmission path T1 (a portion close to the first face S1) in the lateral direction X. The above arrangement enables impedance matching of the transmission path T1 and makes it possible to maintain good high-frequency characteristics of signal transmission through the signal electrode 125.

In the above configuration, the first recess 16 with an inner surface on which the film-shaped first ground conductor 16A is located and the second recess 17 with an inner surface on which the film-shaped second ground conductor 17A is located are used to arrange ground conductors on either side of the signal electrode 125 and part of the transmission path T1. This configuration improves the joining strength between the ground electrode 126 and the module substrate 30. Specifically, when the ground electrode 126 and the electrodes 36 of the module substrate 30 are joined, part of conductive joining material flows into the first recess 16 and the second recess 17 and forms fillets between the first and second recesses 16 and 17 and the module substrate 30. The fillets improve the above joining strength and thereby reduce the occurrence of damage in the joined portions in use of the electronic device 1.

The ground electrode 126 may be located around the openings of the first recess 16 and the second recess 17 on the first face S1. The ground electrode 126 may be connected to the first ground conductor 16A and the second ground conductor 17A. The ground electrode 126 may be in contact with the circular arc a1. Since the first recess 16 and the second recess 17 overlap the circular arc a1 when viewed in the direction perpendicular to the first face S1, and the ground electrode 126 is in contact with the circular arc a1, the joining strength between the ground electrode 126 and the module substrate 30 can be high. Specifically, as in the description of the manufacturing method, the portion of the circular arc a1 is formed by die cutting before firing. Hence, when the conductive joining material is applied after die cutting, the conductive joining material can flow down and hang on the side face S3 at the portions of the ground electrode 126 in contact with the circular arc a1. In the case in which the conductive joining material hangs down on the side face S3, when the ground electrode 126 is joined to the electrodes 36 of the module substrate 30, fillets are likely to be formed between the side face S3 and the electrodes 36 of the module substrate 30. Formation of the fillets improves the joining strength of the ground electrode 126 and thereby reduces the occurrence of damage in the joined portions in use of the electronic device 1.

The above configuration in which the first recess 16 and the second recess 17 overlap the one circular arc a1 when viewed in the direction perpendicular to the first face S1 reduces the occurrence of damage such as a crack in the wiring board 10 when the module substrate 30 and the wiring board 10 are joined. Specifically, forming gentle corner shapes such as round shapes are easy at both end portions of the circular arc a1 when viewed in the direction perpendicular to the first face S1. The circular arc a1 with such a shape is easy to form by die cutting. The first recess 16 and the second recess 17, which are on either side of the signal electrode 125, are located near the end portions of the circular arc a1. Hence, the ground electrode 126 located around the first recess 16 and the second recess 17 is also likely to be near the end portions of the circular arc a1. Hence, when the ground electrode 126 and the electrodes 36 of the module substrate 30 are joined, thermal stress is likely to be exerted on the end portions of the circular arc a1. To address this, since the end portions of the circular arc a1 on which the stress is exerted can have gentle corner shapes, the occurrence of damage such as a crack at the portions can be reduced.

The signal electrode 125, when viewed in the direction perpendicular to the first face S1, may extend from a center region of the first face S1 toward the circular arc a1. This configuration easily enables the first recess 16 and the second recess 17 to overlap the circular arc a1 and to be located on either side of the signal electrode 125.

The signal electrode 125, when viewed in the direction perpendicular to the first face S1, may extend from a first position pa (FIG. 4A) that is closer to the circular arc a1 than to the center of the first face S1 to a second position pb (FIG. 4A) that is away from the outer edge on the first face S1. This configuration easily enables the first recess 16 and the second recess 17 to overlap the circular arc a1 and to be located on either side of the signal electrode 125, and in addition enables the signal electrode 125 to be away from the outer edge of the first face S1. The configuration in which the signal electrode 125 is away from an edge of the first face S1 reduce situations in which the conductive joining material flows to the side face S3 of the base 11 when the signal electrode 125 is joined to the electrode 34 of the module substrate 30. This reduces the occurrence of an unnecessary capacitance component caused due to the conductive joining material flowing to the side face S3 and thereby reduces situations of deterioration in the high-frequency characteristics of the transmission path T1. This also reduces the occurrence of a short circuit between the signal electrode 125 and the ground electrode 126 due to the conductive joining material flowing to the side face S3.

The signal electrode 125 may have a shape the lateral width of which changes stepwise from one end to the other in the longitudinal direction. Regarding the shape of the signal electrode 125, the lateral width of a portion away from the circular arc a1 may be greater than the lateral width of a portion close to the circular arc a1. This shape enables impedance matching in a portion around the signal electrode 125 and makes it possible to maintain good high-frequency characteristics of signal transmission through the signal electrode 125. In FIG. 4B, the portion including the greater lateral width in the signal electrode 125 is farther from the circular arc a1 than the first recess 16 and the second recess 17. This arrangement is suitable for impedance matching.

The signal electrode 125 may be shifted from the normal line L1. Since the signal electrode 125 is shifted from the normal line L1, the signal line of the transmission path T1 can be closer to a straight line, being adapted to the shifted position of the signal electrode 135 on the second face S2. Specifically, when the signal electrode 125 is viewed in the longitudinal direction in a transparent view, the arrangement of the signal electrode 125 on the first face S1, the signal conductor 145 inside the base 11, and the signal electrode 135 on the second face S2 can be closer to a straight line. Also in a transparent view in the direction perpendicular to the first face S1, the arrangement of the signal electrode 125 on the first face S1, the signal conductor 145 inside the base 11, and the signal electrode 135 on the second face S2 can be closer to a straight line. The signal line with this configuration makes it possible to maintain good high-frequency characteristics of the transmission path T1.

Here, the placement shifted from the normal line L1 may refer to a placement in which the signal electrode 125 does not intersect the normal line L1. The placement shifted from the normal line L1 may also refer to a placement in which the signal electrode 125 intersects the normal line L1, and of the two portions into which the signal electrode 125 is divided by the normal line L1, the area of one portion and the area of the other are different. The signal electrode 125, when viewed in the direction perpendicular to the first face S1, may have a shape elongated in one direction. The longitudinal direction of the signal electrode 125 may extend along the normal line L1 and more specifically may be parallel to the normal line L1. The signal electrode 125 may be opposed to the circular arc a1 in the longitudinal direction of the signal electrode 125.

The first recess 16 and the second recess 17 may be arranged such that the distance from the first recess 16 to the signal electrode 125 is equal to the distance from the second recess 17 to the signal electrode 125. With this arrangement, the first recess 16 and the second recess 17 can be symmetric with respect to the signal electrode 125 the position of which is shifted. Specifically, the first recess 16 and the second recess 17 can be symmetric with respect to the plane passing through the center line of the signal electrode 125 in its longitudinal direction and orthogonal to the first face S1. The signal electrode 125 and the signal conductor 145 inside the base 11 may overlap the above plane from their one end to the other. The above symmetric arrangement enables impedance matching of the transmission path T1 and thereby makes it possible to maintain good high-frequency characteristics of the transmission path T1.

Figure 7A:
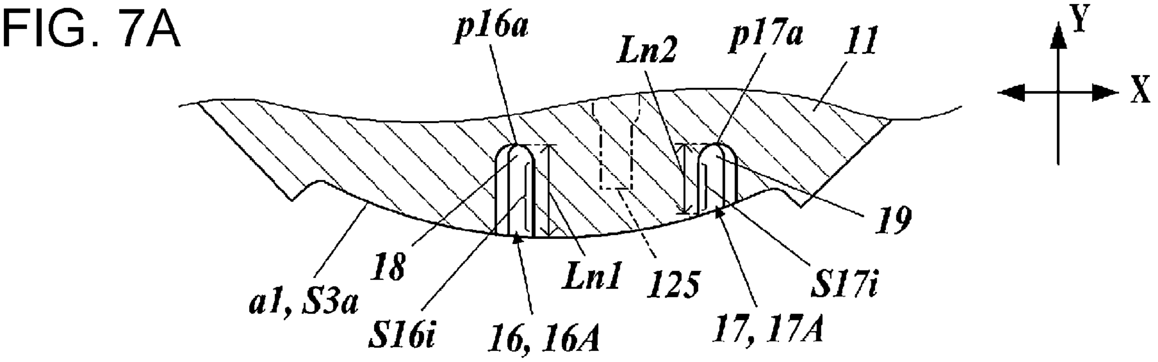
FIG. 7A is a cross-sectional view taken along line A-A in FIG. 6.

The length Ln1 of the first recess 16 in the normal-line direction Y (the dimension in the normal line L1 direction) may be longer than the length Ln2 of the second recess 17 in the normal-line direction Y (the dimension in the normal line L1 direction) (FIG. 7A). With this configuration, when the signal electrode 125, the first recess 16, and the second recess 17 are viewed in a transparent view in the lateral direction X with these overlapping one another, one end portion p16*a* of the first recess 16 and one end portion p17*a* of the second recess 17 can be closer to the same position. In a configuration, these portions can overlap the same point. The above end portions p16*a* and p17*a* on one side refer to the ends farther from the circular arc a1. This arrangement enables the one end portion of the first recess 16 and the one end portion of the second recess 17 to be symmetric with respect the signal electrode 125 and the signal conductor 145 inside the base 11 the positions of which are shifted. Hence, this arrangement enables impedance matching of the transmission path T1 and makes it possible to maintain good high-frequency characteristics of the transmission path T1.

When viewed in the direction perpendicular to the first face S1, the first recess 16 may be located closer to the normal line L1 than the signal electrode 125. This arrangement improves the overall joining strength between the module substrate 30 and the base 11. Specifically, a portion in which a high pressure can be generated when a vibration or a force is imposed on the base 11, in the first face S1 of the base 11 facing the module substrate 30 is the center of the shape protruding outward. Hence, when a vibration or a force is imposed on the base 11, the center point of the circular arc a1 is likely to receive a high pressure. Since the first recess 16 is located near the normal line L1, the joined portion between the ground electrode 136 and the module substrate 30 can be located near the center point of the circular arc a1 which is likely to receive a high pressure. Since the area of the joined portions between the ground electrode 126 and the module substrate 30 is large, the joining strength can be high. Hence, a portion likely to receive a high pressure can have high joining strength, which improves the overall joining strength between the module substrate 30 and the base 11. Although a configuration in which the first recess 16 overlaps the normal line L1 is possible, the first recess 16 may be located so as not to overlap the normal line L1 as illustrated in FIG. 4B. This arrangement enables part of the ground electrode 126 to be joined to the module substrate 30 at the center point of the circular arc a1, and this further improves the joining strength between the wiring board 10 and the module substrate 30.

The ground electrode 126 may have a larger area than the signal electrode 125 and may surround the signal electrode 125 except part of the periphery of the signal electrode 125 on the circular arc a1 side. This configuration of the ground electrode 126 enables impedance matching in a portion around the signal electrode 125 and makes it possible to maintain good high-frequency characteristics of signal transmission through the signal electrode 125.

As illustrated in FIG. 5, the ground electrode 126 includes a first region F1 closer to the first recess 16 than to the second recess 17 and a second region F2 closer to the second recess 17 than to the first recess 16. The first region F1 may be larger than the second region F2. In FIG. 5, the first region F1 is on the left side of a boundary line E1, and the second region F2 is on the right side of the boundary line E1. The first region F1 and the second region F2 may be defined as one region and the other region into which the ground electrode 126 is divided at the center line of the signal electrode 125 (the center line extending in the longitudinal direction). The first recess 16 located in the first region F1 is larger than the second recess 17 located in the second region F2 in length in the normal-line direction Y and is closer to the normal line L1 than the second recess 17 located in the second region F2. Since the ground electrode 126 includes the first region F1, a large number of ground conductors 146 (via conductors) can be connected in this first region F1 with a large area, and this reduces noise propagation between the power-supply electrodes 121 to 124 and the transmission path T1. The reason is as follows. The power-supply electrodes 121 to 124 may be symmetric with respect to the normal line L1, and in this case, the power-supply electrodes 121 and 122 located on the opposite side of the normal line L1 from the signal electrode 125 are far away from the signal electrode 125 in the lateral direction. Hence, when a noise occurs, the noise propagates in a direction oblique to the normal line L1 in the region between the transmission path T1 and the power-supply electrodes 121 and 122 far away from the transmission path T1 in the lateral direction. However, the first region F1 of the ground electrode 126 having a large area and a large number of ground conductors 146 (via conductors) connected to the first region F1 reduce the propagation of the noise.

As illustrated in FIG. 4B, the lateral widths of the portions of the ground electrode 126 in contact with the circular arc a1 may be the same between the first region F1 and the second region F2. Specifically, in the circular arc a1, the widths of the portions of the ground electrode 126 on both the right and left sides of the first recess 16 may be the same as the widths of the portions of the ground electrode 126 on both the right and left sides of the second recess 17. The ground electrode with this configuration enables impedance matching of the transmission path T1 and makes it possible to maintain good high-frequency characteristics of the transmission path T1.

The lateral width of an edge portion 126*e* (FIG. 4B) of the ground electrode 126 on the side far from the circular arc a1 may be approximately equal to the width of the region, from the left-end position p1 to the right-end position p2, in which the power-supply electrodes 121 to 124 are located or may be larger than the lateral width of this region. This configuration further reduces noise propagation between the power-supply electrodes 121 to 124 and the transmission path T1.

The ground electrode 126 with a large area may be partially covered with the insulation film 15 (FIG. 4A). In this configuration, the first region F1 with a large area may be covered with the insulation film 15 in a larger area than the second region F2 with a small area. Covering with the insulation film 15 reduces unevenness of the thickness of the conductive joining material in the state in which the ground electrode 126 and the electrodes 36 of the module substrate 30 are joined, thereby improving the joining strength between the electrodes 36 of the module substrate 30 and the ground electrode 126.

As described earlier, the first filled via 18 and the second filled via 19 may be located at positions closer to the second face S2 than the first recess 16 and the second recess 17. The first filled via 18 may be connected to the first ground conductor 16A, and the second filled via 19 may be connected to the second ground conductor 17A. The first filled via 18 and the second filled via 19 are via conductors the internal conductors of which are exposed on the side face S3 of the base 11. The first filled via 18 and the second filled via 19 can be located on either side, in the lateral direction X, of a portion of the transmission path T1 close to the side face S3, which enables impedance matching of the transmission path T1. This configuration makes it possible to maintain good high-frequency characteristics of the transmission path T1. The presence of the first filled via 18 and the second filled via 19 provides an advantage of reducing production costs compared with a scenario in which the first recess 16 and the second recess 17 are elongated to the positions of the first filled via 18 and the second filled via 19. As in the earlier description of the manufacturing method, the first filled via 18 and the second filled via 19 can be formed in the same process as that of the via conductors of the internal conductors (141 to 146). Unlike these filled vias, for the first recess 16 including the film-shaped first ground conductor 16A on its inner side and the second recess 17 including the film-shaped second ground conductor 17A on its inner side, the shapes of the holes formed in green sheets are different from the ones for the via conductors. In addition, to apply conductive paste only to the inner periphery of the holes, another process besides the one for the via conductors is necessary. Hence, employment of the first filled via 18 and the second filled via 19 reduces the number of layers of green sheets that require the different process mentioned above, thereby reducing production costs.

Figure 6:
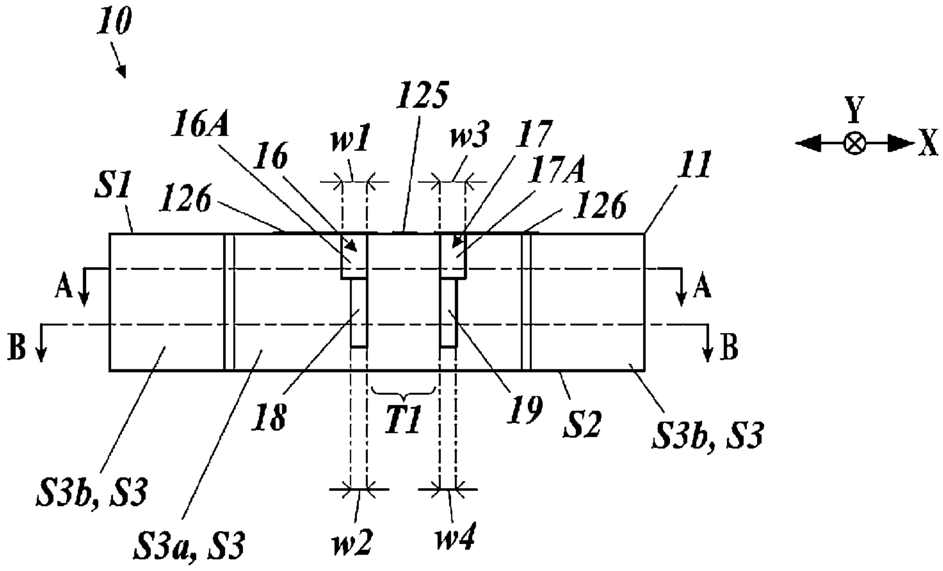
FIG. 6 is a side view of the wiring board in FIG. 1.
Figure 7B:
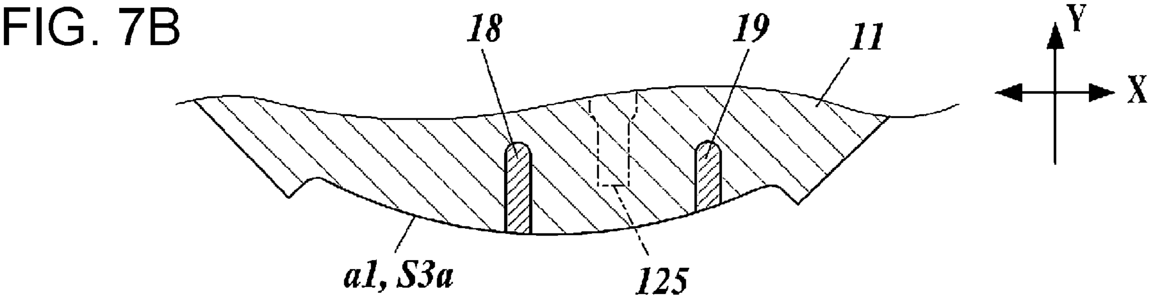
FIG. 7B is a cross-sectional view taken along line B-B in FIG. 6.

FIG. 6 is a side view of the wiring board 10 in FIG. 1. FIGS. 7A and 7B are cross-sectional views of part of the wiring board 10. FIG. 7A is a cross-sectional view taken along line A-A in FIG. 6, and FIG. 7B is a cross-sectional view taken along line B-B in FIG. 6. FIG. 6 is a side view of the wiring board 10 in the normal-line direction Y.

As illustrated in FIG. 7A, the first recess 16 and the second recess 17 may have shapes in which the dimension in the normal-line direction Y is larger than the dimension in the lateral direction X in a cross section parallel to the first face S1. As illustrated in FIG. 7B, the first filled via 18 and the second filled via 19 may have shapes in which the dimension in the normal-line direction Y is larger than the dimension in the lateral direction X in a cross section parallel to the first face S1. The longitudinal directions of the first recess 16, the second recess 17, the first filled via 18, and the second filled via 19 may be parallel to the longitudinal direction of the signal electrode 125 or may be parallel to the normal-line direction Y The first ground conductor 16A may be located on at least the first inner wall surface S16*i* (FIG. 7A) which is the closest to the signal electrode 125 among the inner surfaces of the first recess 16. Similarly, the second ground conductor 17A may be located on at least the second inner wall surface S17*i* (FIG. 7A) which is the closest to the signal electrode 125 among the inner surfaces of the second recess 17. The cross-sectional shapes of the first recess 16 and the second recess 17 mentioned above and the positions of the first ground conductor 16A and the second ground conductor 17A mentioned above enable a portion of the transmission path T1 close to the side face S3 to be flanked by large surfaces of ground conductors in the lateral direction X. The cross-sectional shapes of the first filled via 18 and the second filled via 19 mentioned above enable a portion of the transmission path T1 close to the side face S3 to be flanked by large surfaces of ground conductors in the lateral direction X. Thus, these ground conductors enable impedance matching of the transmission path T1 and make it possible to maintain good high-frequency characteristics of the transmission path T1.

As illustrated in FIG. 7A, the first recess 16 and the second recess 17 may have a round shape at the inner corners (on the side farther from the circular arc a1) (corresponding to the corner shapes closer to the signal electrode 125). In other words, the first recess 16 and the second recess 17 may have a cross-sectional shape created by cutting an elliptical shape or a slotted-hole shape (an elongated hole shape with one end and the other end having semicircular shapes) at an intermediate position in the longitudinal direction. The above round shapes in the first recess 16 and the second recess 17 mitigate stress. This improves the joining strength between the electrode 35 of the module substrate 30 and the ground electrode 126 of the wiring board 10.

As illustrated in FIG. 7B, the first filled via 18 and the second filled via 19 may have a round shape at the inner corners (on the side farther from the circular arc a1) (corresponding to the corner shapes closer to the signal electrode 125). In other words, the first filled via 18 and the second filled via 19 may have a cross-sectional shape created by cutting an elliptical shape or a slotted-hole shape (an elongated hole shape with one end and the other end having semicircular shapes) at an intermediate position in the longitudinal direction. Such a shape simplifies the process of filling the holes serving as the first filled via 18 and the second filled via 19 with conductive paste, when forming the first filled via 18 and the second filled via 19.

As illustrated in FIG. 6, the first filled via 18 and the second filled via 19 may be away from the second face S2. This configuration reduces the volumes of the first filled via 18 and the second filled via 19. This reduces the stress generated at the interface between the first and second filled vias 18 and 19 and the base 11 when these are cooled after the sintering process in the manufacturing processes. Since the first filled via 18 and the second filled via 19 are masses of conductor, and these masses are located inside the base 11 on the side close to the second face S2, damage such as peeling of the first filled via 18 and the second filled via 19 can be reduced.

As illustrated in FIG. 6, the lateral width (the dimension in the lateral direction) w1 of the first recess 16 may be greater than the lateral width (the dimension in the lateral direction) w2 of the first filled via 18. Similarly, the lateral width (the dimension in the lateral direction) w3 of the second recess 17 may be greater than the lateral width (the dimension in the lateral direction) w4 of the second filled via 19. Since the lateral widths w1 and w3 of the first recess 16 and the second recess 17 are greater, the conductive joining material easily flows into the first recess 16 and the second recess 17 when the electrode 35 of the module substrate 30 and the ground electrode 126 of the wiring board 10 are joined. These inflows improve the joining strength at the joined portions. In addition, since the lateral widths w2 and w4 of the first filled via 18 and the second filled via 19 are small, the volumes of the first filled via 18 and the second filled via 19 can be small. The small volumes reduce the stress generated at the interface between the first and second filled vias 18 and 19 and the base 11 when these are cooled after the sintering process in the manufacturing processes. This reduces damage such as peeling of the first filled via 18 and the second filled via 19. The above size relationship between the lateral widths of the first and second recesses 16 and 17 and the first and second filled vias 18 and 19 makes it possible to achieve both improvement in joining strength and reduction of via peeling.

The side faces, closer to the signal electrode 125, of the first recess 16 and the first filled via 18 having different lateral widths w1 and w2 may have the same position so as to overlap each other in a transparent view in the direction perpendicular to the first face S1. Similarly, the side faces, closer to the signal electrode 125, of the second recess 17 and the second filled via 19 having different lateral widths w3 and w4 may have the same position so as to overlap each other in a transparent view in the direction perpendicular to the first face S1. This configuration enables the sides of the first recess 16 and the first filled via 18 facing the transmission path T1 to be connected without a step and enables the sides of the second recess 17 and the second filled via 19 facing the transmission path T1 to be connected without a step, which makes it possible to maintain good high-frequency characteristics of the transmission path T1.

The lateral width w1 of the first recess 16 and the lateral width w3 of the second recess 17 may be constant in the height direction as illustrated in FIG. 6 or may vary in the height direction. When the lateral width w1 of the first recess 16 and the lateral width w3 of the second recess 17 are constant in the height direction, the manufacturing is easy. Similarly, the lateral width w2 of the first filled via 18 and the lateral width w4 of the second filled via 19 may be constant in the height direction as illustrated in FIG. 6 or may vary in the height direction. When the lateral width w2 of the first filled via 18 and the lateral width w4 of the second filled via 19 are constant in the height direction, and the base 11 has a stacked structure, man-hours can be reduced in the manufacturing process.

Note that when the lateral width w1 of the first recess 16 and/or the lateral width w2 of the first filled via 18 vary in the height direction, the statement that the lateral width w1 of the first recess 16 is greater than the lateral width w2 of the first filled via 18 may be defined as the minimum value of the lateral width w1 of the first recess 16 being greater than the maximum value of the lateral width w2 of the first filled via 18.

As described above, the wiring board 10 and the electronic component storage package 20 of the present embodiment provide advantages in that damage in the constituents when the electronic component storage package 20 is mounted on the module substrate 30 can be reduced, and the joining strength with the module substrate 30 can be improved while good high-frequency characteristics are maintained. The electronic device 1 of the present embodiment including the electronic component storage package 20 provides advantages in that reliability of the joint between the module substrate 30 and the wiring board 10 can be improved while good high-frequency characteristics are maintained.

Figure 8:
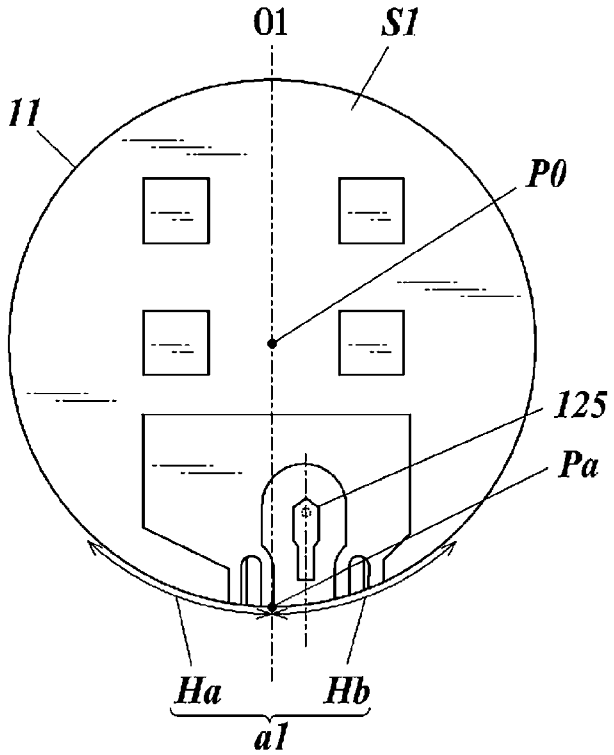
FIG. 8 is a plan view diagram illustrating another example of a wiring board according to the embodiment.

An embodiment of the present disclosure has been described above. However, the present disclosure is not limited to the above embodiment. For example, the above embodiment is based on an example in which the outer shape of the base 11 when viewed in the direction perpendicular to the first face S1 includes the plurality of circular arcs a1 to a4 and the plurality of straight lines b1 to b4. However, the outer shape of the base 11 when viewed in the direction perpendicular to the first face S1 may be, for example, a circle as illustrated in FIG. 8. FIG. 8 is a plan view diagram illustrating another example of a wiring board 10 according to the embodiment. When the outer shape is a circle, a signal electrode 125 located on the first face S1 may be used as a reference to define a circular arc a1 included in the above outer shape. Specifically, a straight line O1 is defined as a line parallel to the longitudinal direction of the signal electrode 125 in a plane viewed in the direction perpendicular to the first face S1 and passing through the center PO of the above circle. Then, a reference point Pa is defined as one of the intersection points of the straight line O1 and the circle of the outer shape of the base 11, the one being closer to the signal electrode 125. A circular arc a1 can be defined as the portion including the ranges Ha and Hb having the same distance clockwise and counterclockwise from the reference point Pa along the circle.

Although in the above embodiment, the first filled via 18 is located above the first recess 16, and the second filled via 19 is located above the second recess 17, a configuration without either the first filled via 18 or the second filled via 19 or both is possible. For example, at least one of the first recess 16 and the second recess 17 may extend to a position near the second face S2 in the height direction without a filled via.

Although the above embodiment describes a configuration in which the wiring board 10 includes the power-supply electrodes 121 to 124, the signal electrode 125, and the ground electrode 126 in film shapes, which are joined to the electrodes 31 to 36 of the module substrate 30, respectively. However, the wiring board 10 may include a plurality of electrode pins instead of the power-supply electrodes 121 to 124, the signal electrode 125, and the ground electrode 126 in film shapes, and the plurality of electrode pins may be connected to the module substrate 30. In this configuration, the electronic component storage package may be a transistor outline (TO)—can package. Note that the number and arrangement of various electrodes and electrode pins can be selected as appropriate depending on the components to be mounted. In addition, details in the description of the embodiment may be changed as appropriate within a scope not departing from the spirit of the present disclosure.

INDUSTRIAL APPLICABILITY

The present invention can be used for wiring boards, electronic component storage packages, and electronic devices.

REFERENCE SIGNS

1 electronic device
10 wiring board
11 base
S1 first face
S2 second face
S3 side face
S3*a* curved surface portion
S3*b* flat surface portion
15 insulation film
16 first recess
S16*i* first inner wall surface
17 second recess
S17*i* second inner wall surface
16A first ground conductor
17A second ground conductor
18 first filled via (first via)
19 second filled via (second via)
a1 to a4 circular arc
b1 to b4 straight line
L1 normal line
T1 transmission path
pa first position
pb second position
Ln1, Ln2 length
w1 to w4 lateral width
20 electronic component storage package
21 frame
22 lid
30 module substrate
50 component
51 electronic component
52 optical component
55 sub-mount
101 component mount portion
121 to 124 power-supply electrode
125 signal electrode
126 ground electrode
F1 first region
F2 second region
141 to 144 power-supply conductor
145 signal conductor
146 ground conductor

The invention claimed is:

1. A wiring board comprising:
a base comprising a first face, a second face opposite to the first face, and a side face between the first face and the second face;
a signal electrode on the first face;
a first recess and a second recess located in the side face and extending to the first face;
a first ground conductor on an inner surface of the first recess; and
a second ground conductor on an inner surface of the second recess, wherein
when viewed in a first direction perpendicular to the first face, an outline of the base comprises at least one circular arc,
when viewed in the first direction, the signal electrode extends from a center region on the first face toward the circular arc and is shifted from a normal line passing through a center point of the circular arc, and
when viewed in the first direction, the first recess and the second recess overlap the circular arc, and the first recess is on one side of the signal electrode, and the second recess is on an other side of the signal electrode.

2. The wiring board according to claim 1, wherein
when viewed in the first direction, the signal electrode is away from an outer edge of the first face.

3. The wiring board according to claim 2, wherein
when viewed in the first direction, the signal electrode extends from a first position closer to the circular arc than to a center of the first face to a second position away from the outer edge of the first face.

4. The wiring board according to claim 1, wherein when viewed in the first direction, the first recess is closer to the normal line than the signal electrode.

5. The wiring board according to claim 4, wherein in a direction parallel to the normal line, a dimension of the first recess is larger than a dimension of the second recess.

6. The wiring board according to claim 1, further comprising:

a first via connected to the first ground conductor; and a second via connected to the second ground conductor, wherein the first via is exposed on the side face at a position closer to the second face than the first recess, and the second via is exposed on the side face at a position closer to the second face than the second recess.

7. The wiring board according to claim 6, wherein when a lateral direction is defined as a direction parallel to the first face and perpendicular to the normal line, in the lateral direction, a dimension of the first via is smaller than a dimension of the first recess, and a dimension of the second via is smaller than a dimension of the second recess.

8. The wiring board according to claim 6, wherein when a lateral direction is defined as a direction parallel to the first face and perpendicular to the normal line, in each of the first recess, the second recess, the first via, and the second via, a dimension in a direction parallel to the normal line is larger than a dimension in the lateral direction, and a corner portion closer to the signal electrode is rounded in a cross section parallel to the first face.

9. The wiring board according to claim 6, wherein the first via and the second via are away from the second face.

10. The wiring board according to claim 1, wherein the first ground conductor is located on at least a first inner wall surface closest to the signal electrode among inner surfaces of the first recess, and the second ground conductor is located on at least a second inner wall surface closest to the signal electrode among inner surfaces of the second recess.

11. The wiring board according to claim 1, further comprising a ground electrode located on the first face, wherein in a direction parallel to the normal line, a dimension of the first recess is larger than a dimension of the second recess, the ground electrode is connected to the first ground conductor and the second ground conductor, and area of a first region of the ground electrode closer to the first recess than to the second recess is larger than area of a second region of the ground electrode closer to the second recess than to the first recess.

12. The wiring board according to claim 1, wherein when viewed in the first direction, the outline of the base comprises the circular arc and a straight line.

13. An electronic component storage package comprising:

the wiring board according to claim 1; and a frame located on the second face.

14. An electronic device comprising:

the electronic component storage package according to claim 13;

an electronic component mounted on the wiring board; and a module substrate joined to the signal electrode, the first ground conductor, and the second ground conductor.

15. A wiring board comprising:

a base comprising a first face, a second face opposite to the first face, and a side face between the first face and the second face;

a signal electrode on the first face;

a first recess and a second recess located in the side face and extending to the first face;

a first ground conductor on an inner surface of the first recess; and a second ground conductor on an inner surface of the second recess, wherein when viewed in a first direction perpendicular to the first face, an outline of the base comprises at least one circular arc, when viewed in the first direction, the signal electrode extends from a center region on the first face toward the circular arc and is shifted from a normal line passing through a center point of the circular arc, when viewed in the first direction, the first recess and the second recess overlap the circular arc, and the first recess is on one side of the signal electrode, and the second recess is on an other side of the signal electrode, when viewed in the first direction, the first recess is closer to the normal line than the signal electrode, and in a direction parallel to the normal line, a dimension of the first recess is larger than a dimension of the second recess.

* * * * *